United States Patent
Rowell et al.

(10) Patent No.: US 10,397,765 B2
(45) Date of Patent: Aug. 27, 2019

(54) EFFICIENT FAR-FIELD MEASUREMENT SYSTEM AND METHOD

(71) Applicant: Rohde & Schwarz GmbH & Co. KG, Munich (DE)

(72) Inventors: Corbett Rowell, Munich (DE); Vincent Abadie, Hohenschaeftlarn (DE); Benoit Derat, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 15/843,463

(22) Filed: Dec. 15, 2017

(65) Prior Publication Data

US 2019/0191268 A1   Jun. 20, 2019

(51) Int. Cl.
| H04B 5/00 | (2006.01) |
| H04W 4/80 | (2018.01) |
| G01R 29/10 | (2006.01) |
| H04W 64/00 | (2009.01) |

(52) U.S. Cl.
CPC .............. *H04W 4/80* (2018.02); *G01R 29/10* (2013.01); *H04W 64/00* (2013.01)

(58) Field of Classification Search
CPC ......... H04W 4/80; H04W 64/00; G01R 29/10
See application file for complete search history.

(56) References Cited

U.S. PATENT DOCUMENTS

| 6,339,393 | B1 | 1/2002 | Burnside et al. | |
| 8,330,640 | B2 | 12/2012 | Liu | |
| 2008/0018450 | A1 | 1/2008 | Volpi et al. | |
| 2010/0271263 | A1* | 10/2010 | Moshfeghi | G01S 5/0263 342/378 |
| 2015/0116164 | A1* | 4/2015 | Mannion | G01R 29/10 343/703 |
| 2018/0027434 | A1* | 1/2018 | Foegelle | H04B 7/0617 455/67.13 |
| 2018/0375594 | A1* | 12/2018 | Kildal | H04B 17/102 |

* cited by examiner

*Primary Examiner* — Xin Jia
(74) *Attorney, Agent, or Firm* — Ditthavong & Steiner P.C.

(57) ABSTRACT

A measurement system is provided. The measurement system comprises a device under test comprising at least one antenna, at least one measurement antenna, and a signal analysis unit. In this context, the location of the at least one antenna of the device under test is unknown with respect to the device under test, whereas the signal analysis unit is configured to perform at least one near-field measurement with respect to the device under test with the aid of the at least one measurement antenna. In addition to this, the signal analysis unit is further configured to locate the at least one antenna of the device under test on the basis of the at least one near-field measurement in order to obtain position data of the at least one antenna of the device under test.

14 Claims, 3 Drawing Sheets

EFFICIENT FAR-FIELD MEASUREMENT SYSTEM AND METHOD

TECHNICAL FIELD

The invention relates to a measurement system and a measurement method for investigating a device under test comprising at least one antenna with respect to the location of its at least one antenna in order to perform efficient and cost-effective far-field measurements.

BACKGROUND ART

Generally, in times of an increasing number of wireless communication applications such as MIMO (Multiple Input Multiple Output) systems, there is a growing need of a measurement system and a measurement method for investigating devices under test applying such systems with special respect to their far-field characteristics in order to verify their proper functioning.

US 2008/0018450 A1 is directed to an interrogator and a method of discerning the presence of an object, and an interrogation system employing the same. Due to the fact that said interrogator employs far-field antennas, it can be seen that far-field measurements are done in the far-field, whereby the respective far-field distance is not reduced to a minimum. As a consequence of this, such a far-field measurement requires much space, which leads to high costs and is therefore inefficient.

Accordingly, there is a need to provide a measurement system and a measurement method for investigating a device under test with special respect to its far-field characteristics in an efficient and cost-saving manner.

SUMMARY OF THE INVENTION

According to a first aspect of the invention, a measurement system is provided. The measurement system comprises a device under test comprising at least one antenna, at least one measurement antenna, and a signal analysis unit. In this context, the location of the at least one antenna of the device under test is unknown with respect to the device under test, whereas the signal analysis unit is configured to perform at least one near-field measurement with respect to the device under test with the aid of the at least one measurement antenna. In addition to this, the signal analysis unit is further configured to locate the at least one antenna of the device under test on the basis of the at least one near-field measurement in order to obtain position data of the at least one antenna of the device under test. Advantageously, knowing the position of the at least one antenna of the device under test allows for reducing the required measurement space.

According to a first preferred implementation form of the first aspect, the signal analysis unit is further configured to calculate position data for the device under test with regard to the position of the at least one measurement antenna. Advantageously, in this manner, accuracy and efficiency of the measurement system can be increased.

According to a further preferred implementation form of the first aspect, the signal analysis unit is further configured to calculate the position data for the device under test such that the position data fulfills quiet-zone requirements with respect to an antenna radiating aperture of the at least one antenna of the device under test. Advantageously, in this manner, accuracy and efficiency of the measurement system can be increased.

According to a further preferred implementation form of the first aspect, the signal analysis unit is further configured to determine a minimum far-field measurement distance between the device under test and the at least one measurement antenna on the basis of the position data of the at least one antenna of the device under test. Advantageously, efficiency of far-field measurements is increased due to the fact that the required measurement space can be reduced to a minimum.

According to a further preferred implementation form of the first aspect, the signal analysis unit is further configured to determine a minimum far-field measurement distance between the device under test and the at least one measurement antenna by $$\frac{2D^2}{\lambda}.$$

In this context, D is a largest dimension of the device under test, preferably the largest dimension of an antenna region of the device under test, and $\lambda$ is the wavelength, preferably the wavelength for the lowest frequency of measurement. Advantageously, efficiency of far-field measurements is increased due to the fact that the required measurement space can be reduced to a minimum.

According to a further preferred implementation form of the first aspect, the measurement system further comprises at least one positioning unit, wherein the at least one positioning unit is configured to position the device under test and/or the at least one antenna of the device under test and/or the at least one measurement antenna on the basis of the position data of the at least one antenna of the device under test. Advantageously, measurements can be performed automatically or semi-automatically.

According to a further preferred implementation form of the first aspect, the measurement system further comprises at least one positioning unit, wherein the at least one positioning unit is configured to position the device under test and/or the at least one antenna of the device under test and/or the at least one measurement antenna on the basis of the position data for the device under test. Advantageously, measurements can be performed automatically or semi-automatically.

According to a further preferred implementation form of the first aspect, the number of the at least one antenna of the device under test is equal to the number of the at least one measurement antenna. Additionally or alternatively, the measurement system further comprises at least one additional measurement antenna, wherein with the aid of the at least one additional antenna, the signal analysis unit is further configured to test for a scan in near-field of the device under test. Advantageously, in this manner, accuracy and efficiency of the measurement system can be increased.

According to a further preferred implementation form of the first aspect, the device under test is a vehicle. Advantageously, especially automated vehicles such as self-driving cars can be investigated with respect to the communication between said vehicles and their environment.

According to a second aspect of the invention, a measurement method is provided. The measurement method comprises the steps of performing at least one near-field measurement with respect to a device under test comprising at least one antenna with the aid of at least one measurement antenna, wherein the location of the at least one antenna of the device under test is unknown with respect to the device under test, and locating the at least one antenna of the device under test on the basis of the at least one near-field measurement in order to obtain position data of the at least one antenna of the device under test. Advantageously, knowing the position of the at least one antenna of the device under test allows for reducing the required measurement space.

According to a first preferred implementation form of the second aspect, the measurement method further comprises the step of calculating position data for the device under test with regard to the position of the at least one measurement antenna. Advantageously, in this manner, accuracy and efficiency of the measurement method can be increased.

According to a further preferred implementation form of the second aspect, the measurement method further comprises the step of calculating the position data for the device under test such that the position data fulfills quiet-zone requirements with respect to an antenna radiating aperture of the at least one antenna of the device under test. In this manner, accuracy and efficiency of the measurement method can be increased.

According to a further preferred implementation form of the second aspect, the measurement method further comprises the step of determining a minimum far-field measurement distance between the device under test and the at least one measurement antenna on the basis of the position data of the at least one antenna of the device under test. Advantageously, efficiency of far-field measurements is increased due to the fact that the required measurement space can be reduced to a minimum.

According to a further preferred implementation form of the second aspect, the measurement method further comprises the step of determining a minimum far-field measurement distance between the device under test and the at least one measurement antenna by $$\frac{2D^2}{\lambda}.$$

In this context, D is a largest dimension of the device under test, preferably the largest dimension of an antenna region of the device under test, and $\lambda$ is the wavelength, preferably the wavelength for the lowest frequency of measurement. Advantageously, efficiency of far-field measurements is increased due to the fact that the required measurement space can be reduced to a minimum.

According to a further preferred implementation form of the second aspect, the measurement method further comprises the step of positioning the device under test and/or the at least one antenna of the device under test and/or the at least one measurement antenna with the aid of at least one positioning unit on the basis of the position data of the at least one antenna of the device under test. Advantageously, measurements can be performed automatically or semi-automatically.

According to a further preferred implementation form of the second aspect, the measurement method further comprises the step of positioning the device under test and/or the at least one antenna of the device under test and/or the at least one measurement antenna with the aid of at least one positioning unit on the basis of the position data for the device under test. Advantageously, measurements can be performed automatically or semi-automatically.

According to a further preferred implementation form of the second aspect, the number of the at least one antenna of the device under test is equal to the number of the at least one measurement antenna. Additionally or alternatively, the measurement method further comprises the step of testing for a scan in near-field of the device under test with the aid of at least one additional antenna. Advantageously, in this manner, accuracy and efficiency of the measurement method can be increased.

According to a further preferred implementation form of the second aspect, the device under test is a vehicle. Additionally or alternatively, the measurement method further comprises the steps of generating a back projection based on at least one current and/or voltage distribution in a reactive near-field of the device under test on the basis of the at least one near-field measurement, assigning each distinct one of the at least one current and/or voltage distribution to an antenna region of the device under test, wherein the antenna region of the device under test is bounded by a certain maximum dimensions value, determining a minimum far-field distance on the basis of the certain maximum dimensions value, and performing at least one far-field measurement with the aid of the at least one measurement antenna within the minimum far-field distance. Advantageously, especially automated vehicles such as self-driving cars can be investigated with respect to the communication between said vehicles and their environment.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
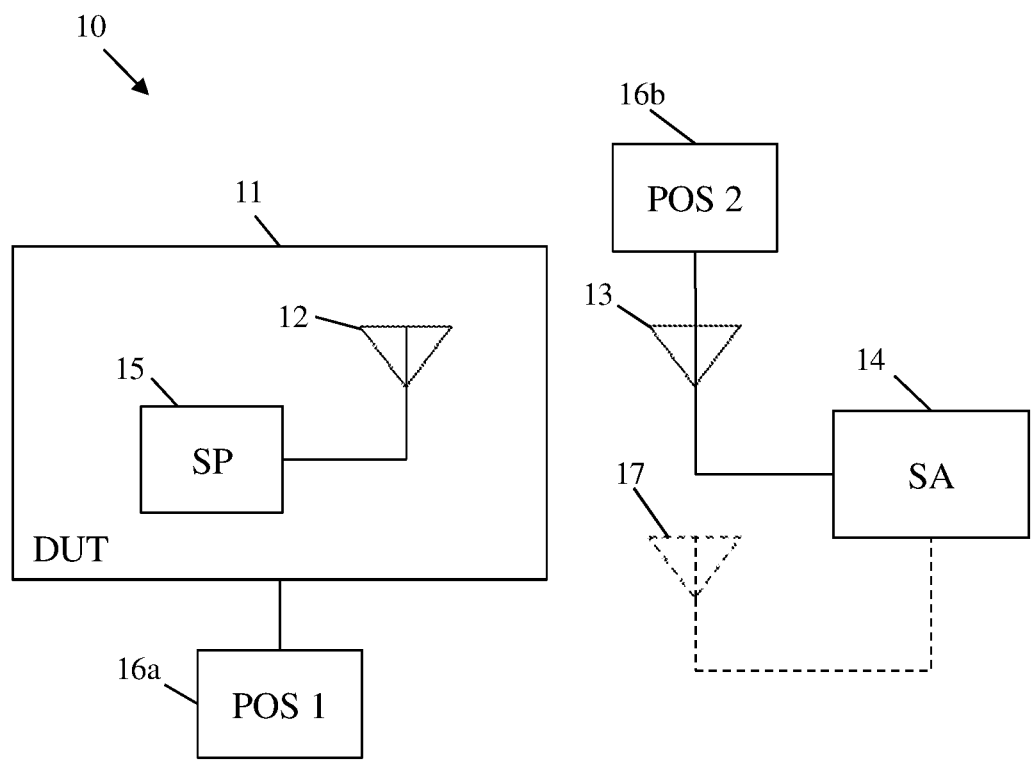
FIG. 1 shows an exemplary embodiment of the first aspect of the invention.

Firstly, FIG. 1 illustrates an exemplary embodiment of the inventive measurement system 10. The measurement system 10 comprises a device under test 11 comprising an antenna 12, a measurement antenna 13, and a signal analysis unit 14 connected to said measurement antenna 13. In addition to this, the device under test 11 comprises a signal processing unit 15 connected to the antenna 12 of the device under test 11. Additionally, the measurement system 10 comprises a first positioning unit 16a connected to the device under test 11, and a second positioning unit 16b connected to the measurement antenna 13. Furthermore, the measurement system 10 may comprise an additional measurement antenna 17 being an optional feature, which is illustrated with the aid of the dotted line.

In this context, the location of the antenna 12 of the device under test 11 is especially unknown with respect to the device under test 11. In other words, the device under test 11 can be also understood as a black-box, wherein antenna locations are generally unknown or wherein a position of at least one antenna comprised by the device under test 11 is unknown. Furthermore, the signal analysis unit 14 is configured to perform at least one near-field measurement with respect to the device under test 11 with the aid of the measurement antenna 13. In addition to this, the signal analysis unit 14 is further configured to locate the antenna 12 of the device under test 11 on the basis of the at least one near-field measurement in order to obtain position data of the antenna 12 of the device under test 11. In other words, the signal analysis unit 14 is configured to scan for at least one antenna comprised by the device under test 11 with the aid of at least measurement antenna in order to obtain position data of said at least one antenna of the device under test 11. As a consequence of this, after measurement, the device under test 11 can be seen as a white-box, wherein antenna locations are known or wherein a position of at least one antenna comprised by the device under test 11 is known.

Additionally or alternatively, the signal analysis unit 14 may further be configured to calculate position data for the device under test 11 with regard to the position of the measurement antenna 13.

In addition to this or as an alternative, the signal analysis unit 14 may further be configured to calculate the position data for the device under test 11 such that the position data fulfills quiet-zone requirements with respect to an antenna radiating aperture of the antenna 12 of the device under test.

Furthermore, the signal analysis unit 14 may preferably be configured to determine a minimum far-field measurement distance between the device under test 11 and the measurement antenna 13 on the basis of the position data of the antenna 12 of the device under test 11.

Additionally or alternatively, the signal analysis unit 14 may further be configured to determine the minimum far-field measurement distance between the device under test and the measurement antenna 13 on the basis of the position data for the device under test 11.

Moreover, the signal analysis unit 14 may further be configured to determine the minimum far-field measurement distance between the device under test 11 and the measurement antenna 13 by $$\frac{2D^2}{\lambda}.$$

In this context, D is a largest dimension of the device under test 11, preferably the largest dimension of an antenna region of the device under test 11, and $\lambda$ is the wavelength, preferably the wavelength for the lowest frequency of measurement.

With respect to the positioning units 16a, 16b, it is noted that the first positioning unit 16a may be configured to position the device under test 11 on the basis of the position data of the antenna 12 of the device under test 11 or on the basis of the position data for the device under test 11. Additionally or alternatively, the first positioning unit 16a may be configured to position antenna 12 of the device under test 11 on the basis of the position data of the antenna 12 of the device under test or on the basis of the position data for the device under test 11. In addition to this, the second positioning unit 16b may be configured to position the measurement antenna 13 on the basis of the position data of the antenna 12 of the device under test 11 or on the basis of the position data for the device under test 11.

With respect to the optional feature of the additional measurement antenna 17, it is noted that with the aid of said additional measurement antenna 17, the signal analysis unit 14 may further be configured to test for a scan in near-field of the device under test 11.

Generally, it should further be mentioned that the number of antennas of the device under test 11 is preferably equal to the number of measurement antennas connected to the signal analysis unit 14. In addition to this, with respect to the device under test 11, it is generally noted that the device under test 11 may preferably be a vehicle such as a car or train or airplane.

Additionally or alternatively, with respect to the signal analysis unit 14, it is noted that the signal analysis unit 14 may further be configured to generate a back projection based on at least one current and/or voltage distribution in a reactive near-field of the device under test 11 on the basis of the above-mentioned at least one near-field measurement. In this context, the signal analysis unit 14 may further be configured to assign each distinct one of the at least one current and/or voltage distribution to an antenna region of the device under test 11, wherein the antenna region of the device under test 11 is bounded by a certain maximum dimensions value. In this manner, the device under test 11 having been a black-box before becomes a white-box, wherein antenna locations of antennas comprised by the device under test 11 are known.

In addition to this or as an alternative, the signal analysis unit 14 may further be configured to determine a minimum far-field distance on the basis of the certain maximum dimensions value. In this context, it is noted that the certain maximum dimensions value is preferably lower than a maximum dimension of the device under test 11. Additionally or alternatively, the signal analysis unit 14 may further be configured to perform at least one far-field measurement with the aid of the measurement antenna 13 within the minimum far-field distance.

Further additionally or as an further alternative, the signal analysis unit 14 may generally be configured to perform at least one far-field measurement with the aid of at least one measurement antenna and/or at least one additional measurement antenna for a white-box antenna region of the device under test 11. In other words, the signal analysis unit 14 may generally be configured to perform at least one far-field measurement with the aid of at least one measurement antenna and/or at least one additional measurement antenna for an antenna region comprised by the device under test 11, wherein the antenna location of at least one antenna comprised by the antenna region is known.

As already mentioned above, the device under test 11 firstly being a black-box with special respect to an antenna location of at least one antenna of the device under test 11 becomes a white-box due to measurement with the aid of the measurement system 10. This situation is exemplarily illustrated with the aid of FIG. 2.

Figure 2:
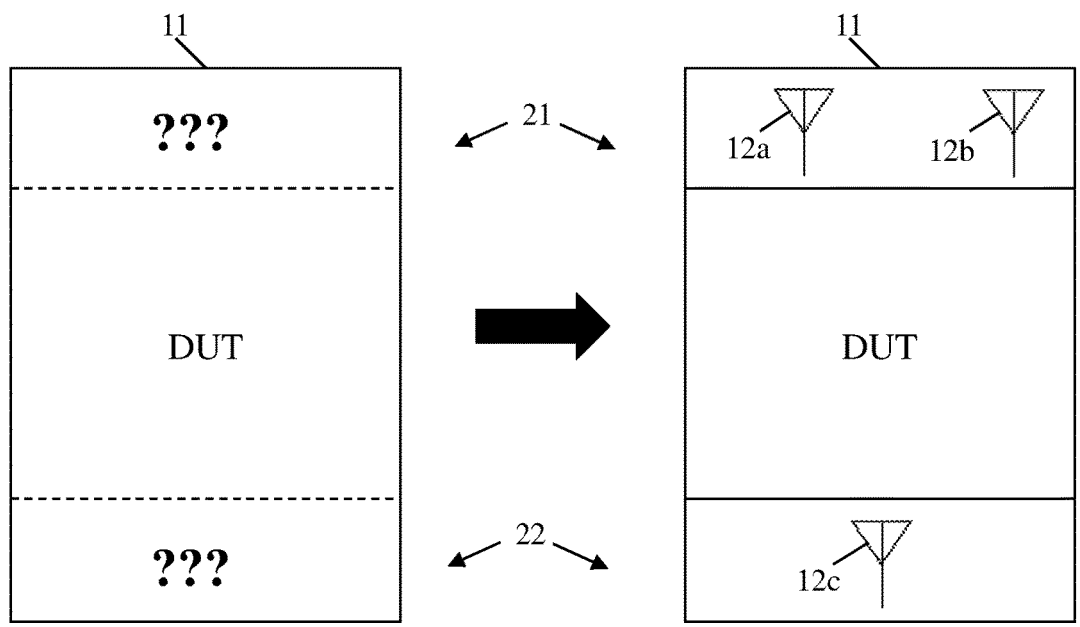
FIG. 2 shows an exemplary conversion from a black-box to a white-box with the aid of the inventive measurement system.

FIG. 2 shows an exemplary conversion from black-box to a white-box. In this context, the device under test 11 has to be understood as a black-box, wherein antenna locations of antennas comprised by the device under test 11 are unknown, which is illustrated by the respective question marks. After having performed at least one measurement with the aid of the measurement system 10, the black-box is converted into a white-box, wherein exemplarily a first antenna region 21 and a second antenna region 22 have been determined. In this exemplary case, the first antenna region 21 of the device under test 11 comprises a first antenna 12a, and a second antenna 12b, whereas the second antenna region 22 of the device under test 11 comprises a third antenna 12c.

Figure 3:
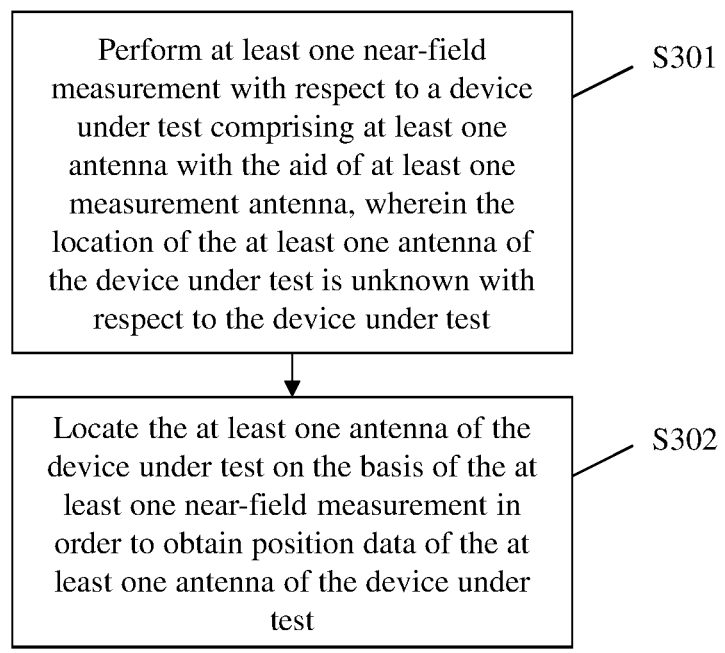
FIG. 3 shows a flow chart of an exemplary embodiment of the second aspect of the invention.

Finally, FIG. 3 shows a flow chart of the inventive method. In a first step S301, at least one near-field measurement is performed with respect to a device under test comprising at least one antenna with the aid of at least one measurement antenna, wherein the location of the at least one antenna of the device under test is unknown with respect to the device under test. Then, in a second step S302, the at least one antenna of the device under test is located on the basis of the at least one near-field measurement in order to obtain position data of the at least one antenna of the device under test.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A measurement system comprising:
a device under test comprising at least one antenna,
at least one measurement antenna, and
a signal analysis unit,
wherein the location of the at least one antenna of the device under test is unknown with respect to the device under test,
wherein the signal analysis unit is configured to perform at least one near-field measurement with respect to the device under test with the aid of the at least one measurement antenna,
wherein the signal analysis unit is further configured to locate the at least one antenna of the device under test on the basis of the at least one near-field measurement in order to obtain position data of the at least one antenna of the device under test,
wherein the signal analysis unit is further configured to calculate position data for the device under test with regard to the position of the at least one measurement antenna, and
wherein the signal analysis unit is further configured to calculate the position data for the device under test such that the position data fulfills quiet-zone requirements with respect to an antenna radiating aperture of the at least one antenna of the device under test.

2. The measurement system according to claim 1, wherein the signal analysis unit is further configured to determine a minimum far-field measurement distance between the device under test and the at least one measurement antenna on the basis of the position data of the at least one antenna of the device under test.

3. The measurement system according to claim 1, wherein the measurement system further comprises at least one positioning unit, wherein the at least one positioning unit is configured to position the device under test and/or the at least one antenna of the device under test and/or the at least one measurement antenna on the basis of the position data of the at least one antenna of the device under test.

4. The measurement system according to claim 1, wherein the measurement system further comprises at least one positioning unit, wherein the at least one positioning unit is configured to position the device under test and/or the at least one antenna of the device under test and/or the at least one measurement antenna on the basis of the position data for the device under test.

5. The measurement system according to claim 1,
wherein the number of the at least one antenna of the device under test is equal to the number of the at least one measurement antenna, and/or
wherein the measurement system further comprises at least one additional measurement antenna, wherein with the aid of the at least one additional antenna, the signal analysis unit is further configured to test for a scan in near-field of the device under test.

6. The measurement system according to claim 1,
wherein the device under test is a vehicle.

7. A measurement system comprising:
a device under test comprising at least one antenna,
at least one measurement antenna, and
a signal analysis unit,
wherein the location of the at least one antenna of the device under test is unknown with respect to the device under test,
wherein the signal analysis unit is configured to perform at least one near-field measurement with respect to the device under test with the aid of the at least one measurement antenna,
wherein the signal analysis unit is further configured to locate the at least one antenna of the device under test on the basis of the at least one near-field measurement in order to obtain position data of the at least one antenna of the device under test, and
wherein the signal analysis unit is further configured to determine a minimum far-field measurement distance between the device under test and the at least one measurement antenna by $$\frac{2D^2}{\lambda},$$

wherein D is a largest dimension of the device under test, preferably the largest dimension of an antenna region of the device under test, and
wherein $\lambda$ is the wavelength, preferably the wavelength for the lowest frequency of measurement.

8. A measurement method comprising the steps of:
performing at least one near-field measurement with respect to a device under test comprising at least one antenna with the aid of at least one measurement antenna, wherein the location of the at least one antenna of the device under test is unknown with respect to the device under test, and
locating the at least one antenna of the device under test on the basis of the at least one near-field measurement in order to obtain position data of the at least one antenna of the device under test,
wherein the measurement method further comprises the step of calculating position data for the device under test with regard to the position of the at least one measurement antenna, and
wherein the measurement method further comprises the step of calculating the position data for the device under test such that the position data fulfills quiet-zone requirements with respect to an antenna radiating aperture of the at least one antenna of the device under test.

9. The measurement method according to claim 8,
wherein the measurement method further comprises the step of determining a minimum far-field measurement distance between the device under test and the at least one measurement antenna on the basis of the position data of the at least one antenna of the device under test.

10. A measurement method comprising the steps of:
performing at least one near-field measurement with respect to a device under test comprising at least one antenna with the aid of at least one measurement antenna, wherein the location of the at least one antenna of the device under test is unknown with respect to the device under test, and
locating the at least one antenna of the device under test on the basis of the at least one near-field measurement in order to obtain position data of the at least one antenna of the device under test,
wherein the measurement method further comprises the step of determining a minimum far-field measurement distance between the device under test and the at least one measurement antenna by $$\frac{2D^2}{\lambda},$$

wherein D is a largest dimension of the device under test, preferably the largest dimension of an antenna region of the device under test, and
wherein $\lambda$ is the wavelength, preferably the wavelength for the lowest frequency of measurement.

11. The measurement method according to claim 8,
wherein the measurement method further comprises the step of positioning the device under test and/or the at least one antenna of the device under test and/or the at least one measurement antenna with the aid of at least one positioning unit on the basis of the position data of the at least one antenna of the device under test.

12. The measurement method according to claim 8,
wherein the measurement method further comprises the step of positioning the device under test and/or the at least one antenna of the device under test and/or the at least one measurement antenna with the aid of at least one positioning unit on the basis of the position data for the device under test.

13. The measurement method according to claim 8,
wherein the number of the at least one antenna of the device under test is equal to the number of the at least one measurement antenna, and/or
wherein the measurement method further comprises the step of testing for a scan in near-field of the device under test with the aid of at least one additional antenna.

14. The measurement method according to claim 8,
wherein the device under test is a vehicle, and/or
wherein the measurement method further comprises the steps of:
generating a back projection based on at least one current and/or voltage distribution in a reactive near-field of the device under test on the basis of the at least one near-field measurement,
assigning each distinct one of the at least one current and/or voltage distribution to an antenna region of the device under test, wherein the antenna region of the device under test is bounded by a certain maximum dimensions value,
determining a minimum far-field distance on the basis of the certain maximum dimensions value, and
performing at least one far-field measurement with the aid of the at least one measurement antenna within the minimum far-field distance.

* * * * *